United States Patent [19]

Sumita et al.

[11] 3,945,833
[45] Mar. 23, 1976

[54] PHOTOSENSITIVE COATING COMPOSITION

[75] Inventors: Masujiro Sumita; Ryozo Konno; Toru Takeuchi, all of Tokyo, Japan

[73] Assignee: Toyo Ink Manufacturing Company, Ltd., Tokyo, Japan

[22] Filed: Sept. 4, 1974

[21] Appl. No.: 503,206

[30] Foreign Application Priority Data

Sept. 4, 1973 Japan .............................. 48-98885

[52] U.S. Cl. .............. 96/115 R; 96/115 P; 106/20; 106/31; 204/159.14; 204/159.15; 204/159.16; 204/159.18; 204/159.19; 204/159.23; 260/28 R; 427/54

[51] Int. Cl.² ............................................. G03C 1/70

[58] Field of Search ..................... 96/115 R, 115 P; 204/159.23, 159.18, 159.19, 159.14, 159.15, 159.16; 427/54

[56] References Cited
UNITED STATES PATENTS

| | | | |
|---|---|---|---|
| 3,427,161 | 2/1969 | Laridon et al. ................... | 96/115 R |
| 3,661,576 | 5/1972 | Crary ............................... | 96/115 R |
| 3,759,807 | 9/1973 | Osborn et al. ................... | 204/159.23 |
| 3,799,915 | 3/1974 | Dunnavant et al. ............. | 260/86.1 R |
| 3,824,164 | 7/1974 | Himics ............................ | 204/159.23 |
| 3,827,959 | 8/1974 | McGinniss ....................... | 96/115 P |
| 3,832,187 | 8/1974 | Kleeberg et al. ................. | 96/115 R |
| 3,833,384 | 9/1974 | Noonan et al. ................... | 96/115 P |
| 3,850,634 | 11/1974 | Steele et al. ...................... | 96/115 R |

Primary Examiner—Ronald H. Smith
Attorney, Agent, or Firm—Sughrue, Rothwell, Mion, Zinn & Macpeak

[57] ABSTRACT

A photosensitive coating composition comprising (1) a prepolymer containing radically cross-linkable ethylenically unsaturated double bonds and (2) a sensitizer which comprises predominantly a mixture of (a) benzophenone, halogenated benzophenone or a combination thereof and (b) 4,4′-bis(diethylamino)benzophenone in a weight ratio of about 1:2 to 10:1.

7 Claims, No Drawings

PHOTOSENSITIVE COATING COMPOSITION

BACKGROUND OF THE INVENTION

1. Field of the Invention

This invention relates to a photosensitive coating composition which can be cured upon exposure to actinic radiation such as ultraviolet light. More particularly, it relates to a photosensitive coating composition comprising (1) a prepolymer containing radically cross-linkable ethylenically unsaturated double bonds and (2) a sensitizer which comprises predominantly a mixture of (a) benzophenone, a halogenated benzophenone or a mixture thereof and (b) 4,4'-bis(diethylamino)benzophenone in a weight of about 1:2 to 10:1.

The "photosensitive coating composition" as used herein is, for example, a ultraviolet light curable type coating varnish or a printing ink containing various pigments, waxes, monomers, stabilizers and the like as optional ingredients which are commonly used in varnishes and printing inks of this type.

2. Brief Description of the Prior Art

Recently there has been the tendency toward eliminating solvents from coating compositions in order to solve possible pollution problems such as air pollution, and extensive investigations are now underway for non-solvent type coating compositions which solidify (dry or cure) on a coated surface. The results of some of these investigations are disclosed in U.S. Pat. Nos. 3,551,235, 3,551,246, 3,551,311, 3,552,986 and 3,558,387, British Pat. No. 1,198,259, Japanese Patent Publication Nos. 10606/57 and 35688/71 and Japanese Patent Laid Open Nos. 38202/72 and 20287/72 and so on. Some of these non-solvent type coating compositions have been tested on their marketability in the printing field, but at present such coating compositions do not have a great market share over the conventional printing inks due to their disadvantages, for example, poor storage stability when the sensitivity is increased and the like.

Coating compositions capable of being cured by irradiation with ultraviolet light, i.e., printing inks or coating varnishes, require a prepolymer containing radically crosslinkable ethylenically unsaturated double bonds and a sensitizer as essential ingredients.

Hitherto many sensitizers are known to generate radicals upon exposure to light. Of these sensitizers, ketone-type sensitizers such as benzoin methyl ether, benzoin ethyl ether, benzoin butyl ether, α-methylbenzoin, α-allylbenzoin, α-chlorodeoxybenzoin and the like, azo compound sensitizers such as azobisisobutyronitrile and the like, quinone-type sensitizers such as anthraquinone, phenanthraquinone and the like, sulfide compound sensitizers such as tetramethylthiuram disulfide and the like are widely employed for plating plates, photoresists or photosensitive paints.

However, particularly in the printing field, it is required that a relatively thick liquid coating film of, for example, ultraviolet light-curable type printing ink or coating varnish be solidified (dried or cured) upon irradiation with ultraviolet light in quite a short period of time, and that, on the contrary, the coating composition must be stable without undergoing a dark reaction on a printing or in a coating machine or in a container. The above described sensitizers increase relatively, but not sufficiently, the sensitivity of the prepolymer when their proportion to a prepolymer is increased. However, the dark reaction is also promoted in proportion to a degree of the sensitization thereby frequently resulting in objectionable phenomena such as gelation of the composition during storage in a container or during operation on machines. Therefore, it is very important to develop a sensitizer which has the ability for high sensitization but no tendency toward causing the dark reaction.

SUMMARY OF THE INVENTION

As a result of various investigations which have been made on non-solvent type coating compositions, a discovery has been made that a synergistic effect which would not be expected from the performance of the individual components used separately can be obtained when a specific combination of sensitizers is incorporated into an ink or a coating varnish. The above discovery is surprising since the synergistic effect can be obtained even though each of the sensitizers is inferior in sensitization and/or poorer storage stability due to the dark reaction. That is, it has been found that a combination of benzophenone, a halogenated benzophenone or a mixture thereof and a 4,4'-bis(diethylamino)benzophenone brings about remarkable effects.

This invention provides a photosensitive coating composition comprising a prepolymer containing radically cross-linkable ethylenically unsaturated double bonds, and a sensitizer which comprises a mixture of (a) benzophenone, a halogenated benzophenone or combination thereof and (b) 4,4'-bis(diethylamino)benzophenone in a weight ratio of (a) to (b) of about 1:2 to 10:1.

DETAILED DESCRIPTION OF THE INVENTION

Prepolymers containing radically cross-linkable ethylenically unsaturated double bonds which can be used in this invention include, for example, epoxy resins containing epoxy groups esterified with acrylic acid or methacrylic acid, alkyd resins containing hydroxyl groups esterified with acrylic acid or methacrylic acid, prepolymers obtainable by reacting an alkyd or a polyester containing hydroxyl groups with an acrylic acid-polyol ester using a diisocyanate and the like. A suitable molecular weight for the prepolymers ranges from about 50 to 30,000, preferably 800 to 15,000.

As a halogenated benzophenone, it is preferable to use a bromobenzophenone or a chlorobenzophenone, and more particularly, combinations of p-chlorobenzophenone or o-chlorobenzophenone with 4,4'-bis(diethylamino)benzophenone can show especially remarkable effects.

The above described combination of sensitizers according to the present invention only exhibits the desired synergistic effect provided that the sensitizers in the combination are combined in the proportion specified herein. According to the specific combination and proportion of sensitizers as defined in this invention, those sensitizers which are quite inferior in sensitization although excellent in storage stability when used alone exhibit unexpectedly excellent sensitivity unaccompanied by any deterioration in storage stability as shown in the Examples hereinafter described.

The proportion of the sensitizers in the final coating compositions, i.e., inks, paints, varnishes, etc., varies depending upon the light transmittance of the coating composition. These sensitizers can be used in a total amount of about 5 to 25%, preferably 8 to 15%, by weight based on the total weight of the composition in a system having a poor light transmittance such as pigment-containing inks and paints and in a total amount of about 1 to 8%, preferably 3 to 6%, by weight based on the total weight of the product in a system having a good light transmittance such as a clear coating varnish.

In order to obtain the above synergistic sensitizing effect, it is necessary that (a) the benzophenone, the halogenated benzophenone or the combination thereof and (b) 4,4'-bis(diethylamino)benzophenone be used in a weight ratio of (a) : (b) of about 1:2 to 10:1, with the most preferable weight ratio being 1:1 to 9:1.

It has not yet been completely clarified why this combination provides a high sensitization to the coating composition without causing any deterioration in storage stability due to the dark reaction which has been regarded as a common phenomenon in conventional sensitizers. It is assumed, however, that radicals generated in both sensitizers cause complicated reactions with each other thereby resulting in unexpected effects. Further, additional sensitizers other than the above enumerated sensitizers of the present invention can also be present in the coating composition without adversely affecting the sensitivity of the coating composition. Suitable examples of additional sensitizers which can be used include ketone-type sensitizers such as benzoin methyl ether, benzoin ethyl ether, benzoin butyl ether, α-methylbenzoin, α-allylbenzoin, α-chlorodeoxybenzoin and the like, azo compound sensitizers such as azobisisobutyronitrile and the like, quinone-type sensitizers such as anthraquinone, phenanthraquinone and the like, sulfide compound sensitizers such as tetramethylthiuram disulfide and the like. The amounts thereof can vary depending upon the objects for use but usually a suitable amount ranges from about 0.1 to 10% by weight. Thus, the only requirement in the coating composition of this invention is to use a mixture comprising (a) benzophenone, a halogenated benzophenone or a combination thereof and (b) 4,4'-bis(-diethylamino)benzophenone in a weight ratio of about 1:2 to 10:1 as main sensitizing ingredients.

Typical examples of the photosensitive coating compositions of this invention include a ultraviolet light-curable type printing ink and a coating varnish. The ultraviolet light-curable type printing ink generally comprises, in addition to the prepolymer and the sensitizers as main ingredients, additional ingredients such as waxes, stabilizers, monomers (diluents), pigments and the like. The coating varnish generally comprises the above prepolymer and sensitizers, as well as waxes, stabilizers, monomers (diluents) and the like.

Waxes which can be used for this purpose include petroleum waxes, white petrolatum and the like having a low boiling point, and can be added to the ink or coating varnish in an amount of about 1 to 4% by weight.

Stabilizers used for preventing the dark reaction include those which are generally called polymerization inhibitors, for example, p-benzoquinone, hydroquinone, p-tert.-butylhydroquinone and the like.

Monomers are incorporated into the coating varnish and ink as a diluent to reduce the viscosity thereof but diluents such as higher alcohols such as undecanol, dodecanol, pentadecanol, etc., higher fatty acid esters which do not cure with light such as tung oil, linseed oil, dehydrated castor oil, oiticica oil, etc. can also be used if some drying due to evaporation or penetration is acceptable. Monomers which can be used include acrylic acid esters of alcohols, e.g., ethylene glycol, polyethylene glycol, trimethylolpropane, pentaerythritol and the like and allyl alcohol esters, e.g., methacrylic acid ester, diallyl phthalate, diallyl maleate and the like.

Any of the pigments which are conventionally known can be used in this invention except for those which interfere with the curing or which deteriorate the storage stability depending upon pigments and utility employed. Suitable examples of pigments which can be used in this invention are inorganic pigments such as, for example, titanium dioxide, iron oxide, carbon black, Prussian blue, etc., and organic pigments such as, for example, conventional azo compounds, phthalocyanine, quinacridone, perylene, perynone, Alkali blue, etc.

The present invention is illustrated in greater detail by reference to the following Examples, but these examples are not to be construed as limiting the present invention. All parts, percentages, ratios and the like are by weight, unless otherwise indicated.

REFERENCE EXAMPLE 1

76.2 parts of Adecasizer-O-130P (a trademark for epoxidized soybean oil manufactured by Asahi Denka K.K., Japan; mean molecular weight: about 1,000; epoxy equivalent: about 200), 23.8 parts of acrylic acid, 0.1 part of hydroquinone and 0.3 parts of triethylenediamine were charged in a four-necked flask equipped with a refluxing condenser and a stirrer. The reaction mixture was allowed to react at a temperature of 90° to 120°C for 15 to 20 hours while bubbling air into the reaction mixture until the acid value of the reaction mixture became less than 1 and then the reaction mixture was removed to obtain epoxidized soybean oil acrylate.

302 parts of the above obtained epoxidized soybean oil acrylate and 290 parts of an acrylated isocyanate obtained from an equimolar reaction between β-hydroxyethylacrylate and toluene diisocyanate were charged in a four-necked flask equipped with a refluxing condenser and a stirrer, and the resulting mixture was allowed to react at 60°C for several hours while bubbling air into the reaction mixture. When the reaction ratio exceeded 80%, β-hydroxyethylacrylate was added in an amount equimolar to the isocyanate which remained unreacted. When the amount of the unreacted isocyanate groups decreased to below 0.2% by weight, the mixture was removed.

REFERENCE EXAMPLE 2

717 parts of Epikote 828 (trademark, produced by Shell Chemical Co., a condensation product of bisphenol A and epichlorohydrin; mean molecular weight: about 370; epoxy equivalent: 184 to 194), 283 parts of acrylic acid, 0.1 part of hydroquinone and 0.3 parts of triethylenediamine were charged in a four-necked flask equipped with a refluxing condenser and a stirrer, and the resulting mixture was reacted at 90°C to 120°C for 15 to 20 hours while bubbling air into the reaction mixture until the acid value became less than 1 and then the reaction mixture was removed to obtain an epoxyacrylate. To 254 parts of the epoxyacrylate thus obtained were added 156 parts of trimethylolpropane triacrylate and 290 parts of the acrylated isocyanate as described in Reference Example 1. The resulting mixture was charged into a four-necked flask equipped with a refluxing condenser and a stirrer, and allowed to react at 60°C for several hours while bubbling air into the reaction mixture. When the reaction ratio exceeded 80%, β-hydroxyethyl acrylate was added to the reaction mixture in an amount equimolar to the remaining unreacted isocyanate. The reaction was continued until the unreacted isocyanate groups decreased to less than 0.2% by weight and the reaction mixture was then removed.

tion of the coating varnish occurred was taken as an indication of storage stability.

The results obtained in this Example are shown in Table 1 below. In this table and Table 2 shown later, 100% in the column headed Ratio indicates that only one sensitizer was used. When two or more sensitizers were used in combination, the proportion of the sensitizers is shown in the same column headed Ratio in terms of the weight percent relative to the total weight of the sensitizers.

Table 1

| Coating Varnish Sample No. | Sensitizer | Ratio (%) | Sensitivity (m/min) | Storage Stability (day) |
|---|---|---|---|---|
| 1 | Benzoin Methyl Ether | 100 | 60 | 2 |
| 2 | Benzoin Ethyl Ether | 100 | '' | 4 |
| 3 | Benzoin Butyl Ether | 100 | 50 | '' |
| 4 | Benzyl | 100 | 8 | More than 30 |
| 5 | Azobisisobutyronitrile | 100 | 8 (not dried) | 2 |
| 6 | Anthraquinone | 100 | 8 | More than 30 |
| 7 | Michler's Ketone | 100 | '' | '' |
| 8 | Benzophenone | 100 | 18 | '' |
| 9 | p-Chlorobenzophenone | 100 | '' | '' |
| 10 | p-Bromobenzophenone | 100 | '' | '' |
| 11 | o-Chlorobenzophenone | 100 | '' | '' |
| 12 | 4,4'-bis(Diethylamino)-benzophenone | 100 | 10 | '' |
| 13 | 4,4'-bis(Diethylamino)-benzophenone | 50 | 50 | '' |
|  | Benzophenone | 50 |  |  |
| 14 | 4,4'-bis(Diethylamino)-benzophenone | 50 | 75 | '' |
|  | p-Chlorobenzophenone | 50 |  |  |
| 15 | 4,4'-bis(Diethylamino)-benzophenone | 50 | 75 | '' |
|  | o-Chlorobenzophenone | 50 |  |  |
| 16 | 4,4'-bis(Diethylamino)-benzophenone | 50 | 60 | '' |
|  | 2,4-Dichlorobenzophenone | 50 |  |  |
| 17 | Benzoin Ethyl Ether | 50 | 30 | 4 |
|  | p-Chlorobenzophenone | 50 |  |  |
| 18 | 4,4'-bis(Diethylamino)-benzophenone | 50 | 20 | More than 30 |
|  | Benzyl | 50 |  |  |

EXAMPLE 1

A coating varnish was prepared using the prepolymer obtained in Reference Example 1 and each of the sensitizers or combinations of sensitizers indicated in Table 1 below according to the following standard formulation, respectively:

| Coating Varnish Standard Formulation | |
|---|---|
| Prepolymer | 97 parts |
| Sensitizer | 3 parts |
| Total | 100 parts |

Each of the resulting coating varnishes was applied onto a piece of tin plate in a thickness of 2 mm using an applicator. The coated plate was placed on a belt conveyor and passed at a 13 cm distance below a 2 KW-high pressure mercury lamp having an input energy of 60 W/cm. The sensitivity was determined in terms of the conveyor speed (m/min) required for curing each of the coating varnishes on the tin plate.

In order to evaluate the influence of sensitizers on the dark reaction, each coating varnish was placed in a vessel and allowed to stand in a thermostatic chamber maintained at 40°C, and the number of days until gela- As is apparent from the results shown in Table 1 above, coating varnish Sample Nos. 1 to 3 exhibited relatively good sensitivity but poor storage stability and Sample Nos. 4 to 12 were good in storage stability but poor in sensitivity. From the overall point of view sample Nos. 13 to 18 were much more excellent.

EXAMPLE 2

A magenta ink for off-set printing was prepared using the prepolymer obtained in Reference Example 2 and each of sensitizers indicated in Table 2 below according to the following standard formulation:

| Formulation | part |
|---|---|
| Carmin 6BH (a trademark of a red pigment manufactured by Toyo Ink Mfg. Co., Ltd.) | 15.0 |
| Prepolymer | 45.8 |
| Sensitizer | 20.0 |
| White Petrolatum | 4.0 |
| Hydroquinone | 0.2 |
| Trimethylolpropane Triacrylate | 15.0 |
| Total | 100.0 |

Each of the resulting printing inks was printed onto an art paper (coated paper) in an amount of 30 mg/100 cm² using an RI-tester manufactured by Akira Seisaku-sho. Immediately after the printing, the printed article was placed on a belt conveyer and passed at a distance of 13 cm below a 2 KW-high pressure mercury lamp having an input energy of 60 W/cm. The sensitivity was determined in terms of the conveyor speed (m/min) required for drying each of the printing articles. Further, in the same manner as described in Example 1, each of the inks was placed in a vessel and subjected to the test for evaluation of the influence on the dark reaction.

The results obtained are shown in Table 2 below.

Table 2

| Ink Sample No. | Sensitizer | Ratio (%) | Sensitivity (m/min) | Storage Stability (day) |
| --- | --- | --- | --- | --- |
| 1 | Benzoin Ethyl Ether | 100 | 24 | 1 |
| 2 | Michler's Ketone | 100 | 8 (not dried) | More than 30 |
| 3 | Tetraethyl-p,p'-diaminobenzophenone | 100 | " | " |
| 4 | p-Chlorobenzophenone | 100 | " | " |
| 5 | o-Chlorobenzophenone | 100 | " | " |
| 6 | p-Bromobenzophenone | 100 | " | " |
| 7 | Benzophenone | 100 | " | " |
| 8 | Tetraethyl-p,p'-diaminobenzophenone<br>Benzophenone | 50<br>50 | 20 | " |
| 9 | Tetraethyl-p,p'-diaminobenzophenone<br>p-Chlorobenzophenone | 50<br>50 | 30 | " |
| 10 | 4,4'-bis(Diethylamino)-benzophenone<br>p-Chlorobenzophenone | 10<br>90 | 35 | " |
| 11 | 4,4'-bis(Diethylamino)-benzophenone<br>p-Chlorobenzophenone | 30<br>70 | 32 | " |
| 12 | 4,4'-bis(Diethylamino)-benzophenone<br>p-Chlorobenzophenone | 60<br>40 | 25 | " |
| 13 | 4,4'-bis(Diethylamino)-benzophenone<br>p-Bromobenzophenone<br>Benzyl | 10<br>70<br>20 | 28 | " |

It was found from the above results, sensitizers which showed poor results when used individually as shown in Sample Nos. 2 to 7 exhibited extremely excellent effects when used in combination as shown in Sample Nos. 8 to 13.

While the invention has been described in detail and with reference to specific embodiments thereof, it will be apparent to one skilled in the art that various changes and modifications can be made therein without departing from the spirit and scope thereof.

What is claimed is:

1. A photosensitive coating composition comprising
   1. a prepolymer containing radically cross-linkable ethylenically unsaturated double bonds, and
   2. a sensitizer which comprises a mixture of (a) a halogenated benzophenone (b) 4,4'-bis(diethylamino)benzophenone in a weight ratio of (a) to (b) of about 1:2 to 10:1.

2. The photosensitive coating composition of claim 1, wherein the weight ratio of (a) to (b) is 1:1 to 9:1.

3. The photosensitive coating composition of claim 1, wherein said halogenated benzophenone is a bromobenzophenone or a chlorobenzophenone.

4. The photosensitive coating composition of claim 1, wherein said sensitizer comprises a mixture of (a) p-chlorobenzophenone or o-chlorobenzophenone and (b) 4,4'-bis(diethylamino) benzophenone.

5. The photosensitive coating composition of claim 1, wherein said prepolymer is an epoxy resin containing epoxy groups esterified with acrylic acid or methacrylic acid, an alkyd resin containing hydroxyl groups esterified with acrylic acid or methacrylic acid, a prepolymer obtained by reacting an alkyd resin with an acrylic acid-polyol ester using a diisocyanate or a polyester resin containing hydroxyl groups with an acrylic acid-polyol ester using a diisocyanate.

6. The photosensitive coating composition of claim 1, wherein said composition is a printing ink and additionally includes a pigment and at least one of a wax, a stabilizer and a monomer diluent and wherein said sensitizer is present in an amount of about 5 to 25% by weight based on the total weight of the printing ink composition.

7. The photosensitive coating composition of claim 1, wherein said composition is a clear coating varnish and includes additionally at least one of a wax, a stabilizer, and a monomer diluent and wherein said sensitizer is present in an amount of about 1 to 8% by weight based on the total weight of the coating varnish composition.

* * * * *